United States Patent [19]

Snyder, Jr.

[11] Patent Number: 4,519,080

[45] Date of Patent: May 21, 1985

[54] ANALOG THRESHOLD DECODER

[75] Inventor: John S. Snyder, Jr., Monrovia, Md.

[73] Assignee: Communications Satellite Corporation, Washington, D.C.

[21] Appl. No.: 437,600

[22] Filed: Oct. 29, 1982

[51] Int. Cl.³ ............................................. G06F 11/10
[52] U.S. Cl. ...................................................... 371/43
[58] Field of Search .............................. 371/43, 44, 45

[56] References Cited

U.S. PATENT DOCUMENTS

| 4,130,818 | 12/1978 | Snyder, Jr. | 371/43 |
| 4,322,848 | 3/1982 | Snyder, Jr. | 371/43 |
| 4,328,582 | 5/1982 | Battail et al. | 371/37 |
| 4,404,674 | 9/1983 | Rhodes | 371/43 |

Primary Examiner—Charles E. Atkinson

Attorney, Agent, or Firm—Sughrue, Mion, Zinn, Macpeak and Seas

[57] ABSTRACT

A modified Type I decoder generates analog syndrome bits from a selected combination of analog signals representing bits yet to be decoded and digital signals representing already decoded information bits. A selected combination of analog syndrome bits is used to generate a weighted majority decision by analog summation. The weighted majority decision is compared to a variable threshold signal which is proportional to the analog magnitude of the bit being decoded. The decision signal which results from this comparison is used to correct the digital value of the bit being decoded. The required number of analog multipliers is reduced by coupling a plurality of multipliers in series and storing the outputs from different analog multipliers in respective analog storage devices.

18 Claims, 5 Drawing Figures

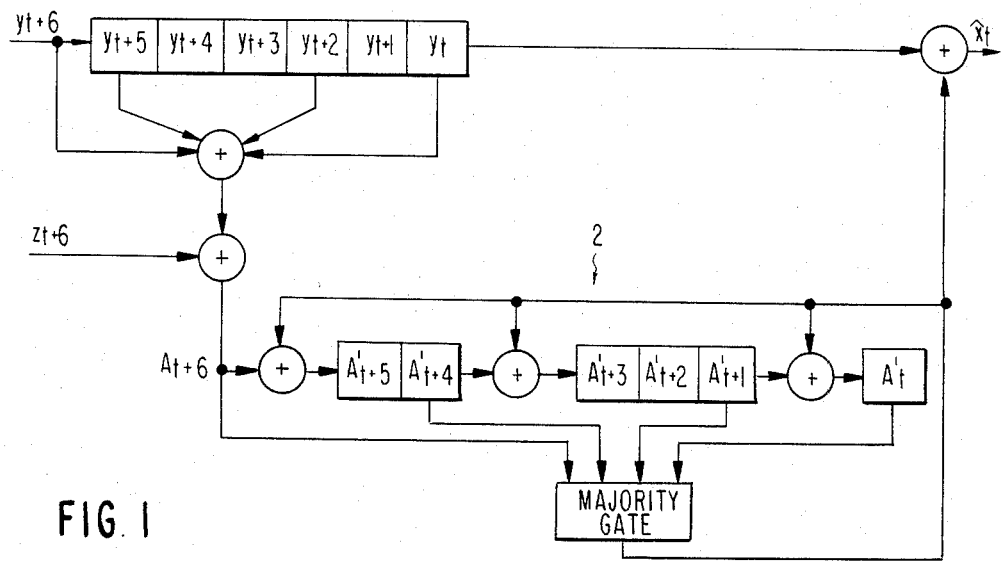
FIG. 1
FIG. 2
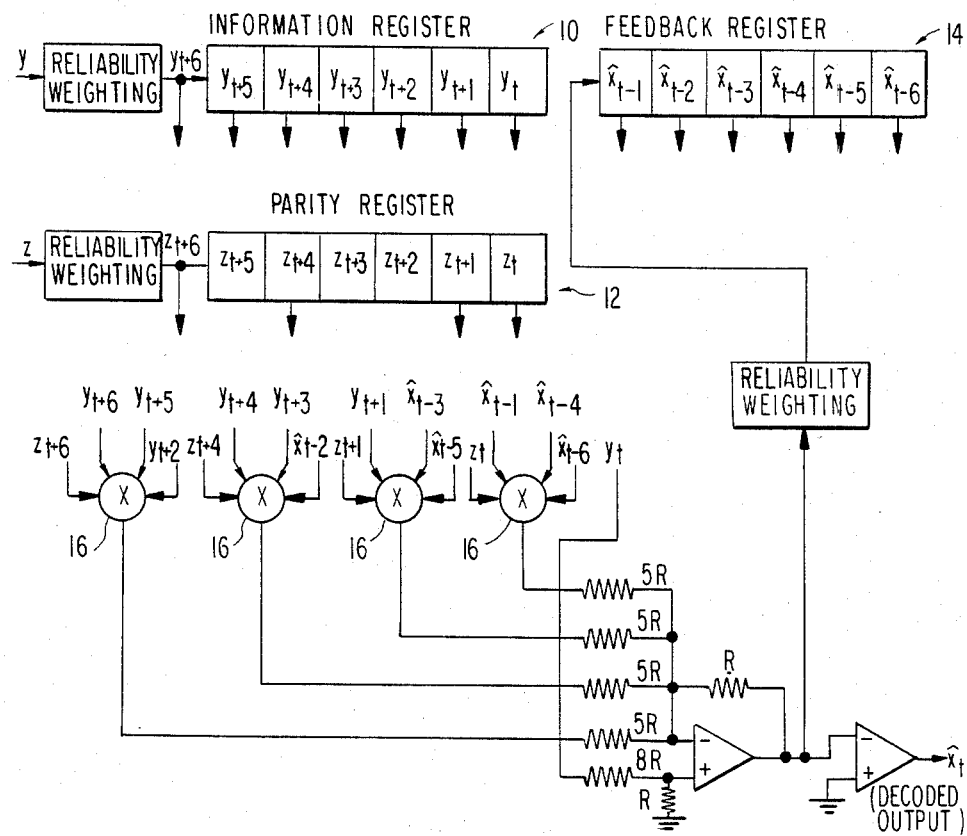

ANALOG THRESHOLD DECODER

BACKGROUND OF THE INVENTION

This invention is related to threshold decoding, and more particularly to analog threshold decoding.

Conventionally, the output of a demodulator is a binary quantity which is set to a 1 or a 0 depending upon whether or not the demodulator wave form exceeds a predetermined decision level. Such binary or "hard" decisions ignore useful probability information which is present in the received signal, thus reducing the possible gain of the coding method.

Threshold decoders are typically separated into two different types, a Type I decoder which develops $d_m - 1$ parity checks on a single output estimate, where $d_m$ is the minimum distance of the code, and a Type II decoder which produces $d_m$ estimates of each output bit from which to make a majority decision.

FIG. 1 illustrates a typical Type I hard-decision decoder which contains a replica of the encoder used to recalculate parity bits from the received information (Y). The recalculated parity sequence is compared to the received parity sequence (Z) and the resulting syndrome pattern is stored in a shift register 2. The contents of the syndrome register are used to form the parity checks, with a majority decision of the parity checks determining whether or not an output bit is to be corrected. If desired, and as shown in FIG. 1, the majority decision can be fed back to the register 2 to update the syndrome.

For applications requiring a higher coding gain than can be obtained with hard decisions, "soft" decoding techniques can be employed while retaining the simple structure of the hard decision threshold decoder. Previous applications of soft decisions to digital threshold decoding, such as described in copending application Ser. No. 282,319 filed July 10, 1981, now U.S. Pat. No. 4,404,674 issued Sept. 13, 1983, have resulted in decoder configurations considerably more complex than hard-decision threshold decoders.

An alternative and less complex technique for utilizing probability information present in the received signal is analog threshold decoding of the type described in my prior U.S. Pat. No. 4,130,818. The analog threshold decoder does not require analog-to-digital conversion of the soft demodulator output, but instead utilizes analog shift registers to store the demodulator output directly. The shift register stages are then tapped in the same manner as for hard decision threshold decoding, but analog multiplications of the tapped signals replace the conventional modulo-2 additions, i.e. Exclusive OR operations, and algebraic summation is used in place of the typical majority vote. In this manner, reliability-weighted output estimates are produced directly without the need for intermediate hard-decision decoding as in previous digital techniques.

An improvement in the decoder of U.S. Pat. 4,130,818 is disclosed in my subsequent Pat. No. 4,322,848. As described therein, a reliability weighting can be provided at the input to the decoder to achieve improved performance. A rate one-half systematic convolutional code having a generator polynomial G=1100101 is a self-orthogonal code having a minimum distance of 5 to thereby guarantee the correction of all combinations of two errors in one constraint length with hard decision decoding. The analog threshold decoder of U.S. Pat. No. 4,322,848 for such a code is illustrated in FIG. 2 and utilizes a plurality of tapped analog shift registers 10, 12 and 14 each comprising a charge transfer device of the bucket brigade type. The received analog information (Y) and parity (Z) sequences first undergo a reliability transformation and the reliability-weighted bit streams then enter their corresponding analog shift registers 10 and 12. In addition, the third register 14 stores reliability weighted outputs to permit feedback of previously-decoded output bits.

In place of the Exclusive-OR (EOR) gates of the hard-decision decoder, multipliers 16 form reliability-weighted output estimates composed of the products of various shift register stages. Since each multiplication involves an even number of terms in this case, all multiplier outputs are inverted in forming the summation, so that the output will have a polarity comparable to that which would be achieved with a digital EOR operation, e.g. with a positive signal corresponding to a digital logic "1" and a negative signal corresponding to a digital logic "0". The fifth estimate, since it consists of an odd number of terms, i.e. a single term is not inverted. The summing amplifier forms the average of the five estimates which is then fed to a comparator to form a binary output.

Although the analog threshold decoder shown in FIG. 2 achieved an additional 1.4 dB of coding gain over that achieved by hard-decision threshold decoding with a rate one-half double-error-correcting convolutional code, it is not without its disadvantages. Specifically, since integrated circuit multipliers are available as two-input devices, each of the multipliers 16 shown in FIG. 2 must be formed from a combination of three analog multipliers, thus requiring a total of 12 multipliers for this configuration. Further, this number of multipliers will increase with both higher code rate and longer constraint length.

It would be desirable, therefore, to decrease the number of multipliers required in an analog decoder. Such a reduction would improve the usefulness of the technique for single-channel-per-carrier applications.

SUMMARY OF THE INVENTION

It is therefore an object of this invention to provide an analog threshold decoder which achieves a satisfactorily high coding gain while reducing the number of multipliers required in a conventional decoder.

Briefly, this and other objects of the invention are achieved by an analog threshold decoder which combines soft decisions with the simple structure of a hard-decision threshold decoder. The decoder stores the received information in parity sequences in analog form after clamped unity gain reliability weighting without any alteration by feedback. Each syndrome bit is computed individually so that each such comparison of a recalculated parity bit and a received parity bit can be made using highly reliable digital values for information bits already decoded, and analog values corresponding to bits which have not yet been decoded. Two digital registers are used, one for storing previously decoded output bits and the other for providing the bit currently being decoded. A plurality of analog shift registers are also provided for storing the analog reliability of the information and parity bits. The number of multipliers required are minimized by sharing the multipliers and by performing all multiplications at the inputs of the shift registers.

BRIEF DESCRIPTION OF THE DRAWINGS

FIG. 1 is a block diagram of a conventional hard-decision Type I digital decoder;

FIG. 2 is a block diagram of a conventional Type II analog threshold decoder;

DETAILED DESCRIPTION OF THE INVENTION

The invention will be described for the case of a rate $\frac{1}{2}$ systematic convolutional code with generator polynominal G=1100101 in order to facilitate comparison with the above-described prior art. It should be appreciated, however, that such a code is used by way of example only.

Figure 3:
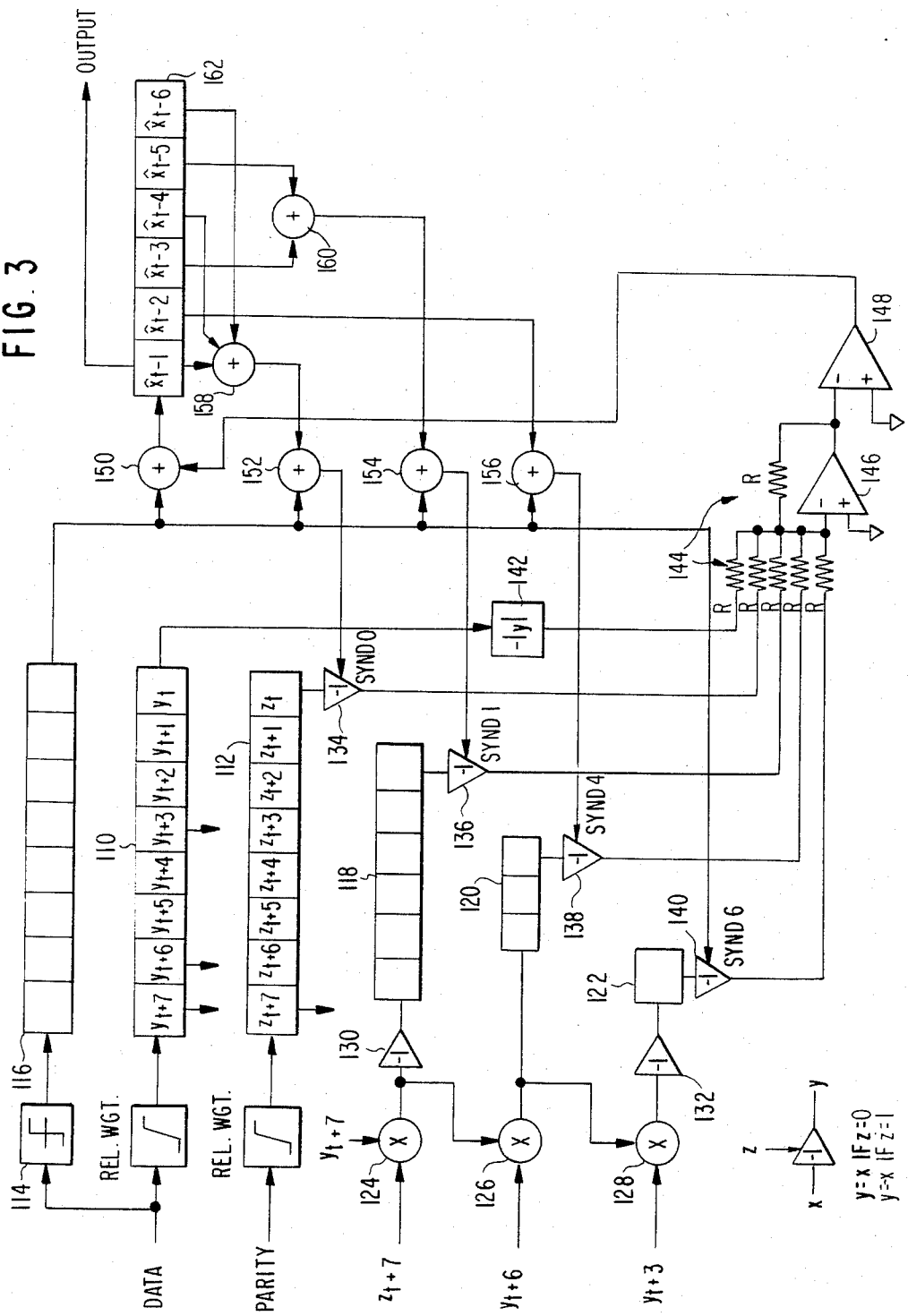
FIG. 3 is a block diagram of an improved analog threshold decoder according to the present invention.

The improved analog threshold decoder according to the present invention is illustrated in FIG. 3. As will become more clear from the following description, the improved decoder is a modified Type I decoder wherein a parity check syndrome is generated and the decoded bit is either passed or changed in accordance with a weighted majority polling of the syndrome bits. The decoder includes an information register 110 and parity register 112 which are analog shift registers similar to those used in the prior art decoder of FIG. 2, these shift registers storing the data and parity bits after reliability weighting. The decoder further includes a hard detector 114 which may be a simple threshold comparator, and a digital shift register 116 for storing the hard-detected digital data. The decoder further includes analog registers 118, 120 and 122, analog multipliers 124, 126 and 128, and inverters 130 and 132 for inverting the multiplier output provided to each of registers 118 and 122, respectively. As described above, this is necessary to preserve the same polarity as an Exclusive OR operation whenever an even number of terms are involved in an analog multiplication.

Controllable inverters 134, 136, 138 and 140 are provided at the output of each of the registers 112, 118, 120 and 122, respectively. These inverters will invert their inputs when their control terminals are in a first state and will pass their inputs without inversion when their control terminals are in a second state. For example, each controllable inverter will invert its input if its control terminal is a logic "1", and will pass its input signal without inversion if its control signal is a logic "0". These controllable inverters are provided for the same purpose as inverters 130 and 132.. If an even number of terms involved in the output of adder 152 are "1", the output of adder 152 will be "0" and the input to controllable inverter 134 will be passed as is. If an odd number of "1"s are involved in the output of adder 152, its output will be "1" and the controllable inverter 134 will then invert its input to provide the same signal polarity as would have been achieved if all of the involved inputs had been EOR'ed. Indeed, it can be seen that all of controllable inverters 134-140 function as EOR gates while preserving the analog nature of their inputs from the respective analog shift registers.

An inverting absolute value circuit 142 is provided to receive the output of the register 110.

The outputs of the controllable inverters 134-140 and the inverting absolute value circuit 142 are combined in a summation network comprising a plurality of resistors 144, operational amplifier 146 and comparator 148.

The decoder further includes modulo-2 adders 150, 152, 154, 156, 158 and 160, and a digital shift register 162 for receiving and storing outputs from the adder 150 and providing selected taps as inputs to the adders 156, 158 and 160.

The operation of the decoder of FIG. 3 should be apparent, but will be briefly described. The analog registers 110 and 112 store the reliability-weighted analog received information and parity signals. The analog multiplier 124 multiplies the analog values $y_t+7$ and $z_t+7$ and provides this product through the inverter 130 to the register 118. The analog multiplier 126 multiplies the output from multiplier 124 with the analog value $y_t+6$ received from register 110, and this second product is provided to the analog register 120. Finally, the multiplier 218 receives the output from multiplier 126 and multiplies it together with the analog value $y_t+3$ received fromm the register 110, and the output of multiplier 128 is provided through an inverter 132 to the register 122.

The digital hard-detected received information signals are stored in a shift register 116, with the current hard-detected signal being provided as an input to each of the modulo-2 adders 150-156 and to the controllable inverter 140. The output of the comparator 148 comprises a weighted majority decision on a parity check syndrome and is provided as one input to the adder 150. As is well-known in modulo-2 addition, the output of the adder 150 will be the same as the hard-detected input received from the register 116 if the signal received from comparator 148 is low, i.e. a logic "0", whereas the output of the adder 150 will be the complement of the hard-detected information signal if the output of comparator 148 is a high level, i.e. a logic "1".

The finally detected output from the adder 150 is provided as an input to shift register 162 which provides selected tap outputs to the adders 156, 158 and 160, the latter two of which provide their outputs to adders 152 and 154, respectively, for addition with the hard-detected current information signal. The outputs of adders 152, 154 and 156 will determine whether or not the signals from the registers 112, 118 and 120, respectively, to the summation network are inverted or passed as is, while the hard-detected information signal from the register 116 will act as the control signal for the controllable inverter 140. The outputs from the controllable inverters 134-140 and the inverting absolute value circuit 142 will represent the various parity check syndrome bits which are combined in the summation network to provide a signal at the output of comparator 148 indicating whether or not the hard-detected information signal should be inverted before it is passed to the output shift register 162.

The similarity between the decoder of FIG. 3 and that of FIG. 1 will be apparent upon a careful comparison of the two figures. As in FIG. 1, the hard-detected output $y_t$ is either passed or inverted by a modulo-2 adder in response to an output from a majority decision network. For any given current output $y_t$ in the hard-decision decoder of FIG. 1, the majority decision is based upon syndrome bits $A_0$, $A_{T+1}$, $A_{T+4}$ and $A_{T+6}$, with each syndrome bit being generated by the modulo-2 addition of a received parity check bit and a regenerated parity check bit, so that the equations defining the various parity check syndrome bits are as follows:

$$A_l = Z_l + Y_l + Y_{l-1} + Y_{l-4} + Y_{l-6}$$

$$A_{l+1} = Z_{l+1} + Y_{l+1} + Y_l + Y_{l-3} + Y_{l-5}$$

$$A_{l+4} = Z_{l+4} + Y_{l+4} + y_{l+3} + Y_l + Y_{l-2}$$

$$A_{l+6} = Z_{l+6} + Y_{l+6} + Y_{l+5} + Y_{l+2} + Y_l$$

Referring now to FIG. 3, it is seen that adder 158 combines the decoded output bits $X_{l-1}$, $X_{l-4}$ and $X_{l-6}$, and adder 152 combines these with the information bit $y_l$, the output from the adder 152 being used as the control input to the controllable inverter 134 which either passes or inverts the parity bit $Z_l$. The output from the controllable inverter 134 is therefore a function of the same information and parity bits as is the syndrome bit $A_l$ in the Type I decoder of FIG. 1.

Similarly, the values $X_{l-3}$ and $X_{l-5}$ are combined in adder 160 and subsequently combined in adder 154 with the current detected information signal $Y_l$, and the output of the adder 154 is used as the control signal to the controllable inverter 136 which either passes or inverts the final stage output from register 118, which final stage output includes the product of analog received signal $Y_{l+1}$ and $Z_{l+1}$. Thus, the output from the controllable inverter 136 is a function of the same information and parity signals as is the syndrome bit $A_{l+1}$ in the decoder of FIG. 1.

Adder 156 combines the decoded signal $X_{l-2}$ with the current detected signal $Y_l$, and the output of adder 156 is provided as the control signal to the controllable inverter 138 which passes or inverts the contents of the final stage in shift register 120. At this time, the final stage content of register 120 will be the product of analog voltages $Z_{l+4}$, $Y_{l+4}$ and $Y_{l+3}$, so that the output from the controllable inverter 138 will be a function of the same information and parity signals as is the syndrome bit $A_{l+4}$ in the decoder of FIG. 1.

Finally, the detected information signal $Y_l$ is provided as the control signal to controllable inverter 140 which passes or inverts the contents of register 122. At this time, the register 122 stores an analog voltage corresponding to the product of signals $Z_{l+6}$, $Y_{l+6}$, $Y_{l+5}$ and $Y_{l+2}$, so that the output from controllable inverter 140 would be a function of the same information and parity signals as is the syndrome bit $A_{l+6}$ in the decoder of FIG. 1.

While the outputs from the controllable inverters 134-140 are functions of the same variables as the corresponding syndrome bits in the decoder of FIG. 1, it should be emphasized that the outputs of these controllable inverters are analog values which are derived either directly or from products of reliability-weighted analog voltages stored in the registers 110 and 112. Accordingly, the decoder in FIG. 3 uses syndrome bits each of which includes its own reliability information. Further, the majority decision also takes into account the analog amplitude value $y_l$ of the information signal currently being decoded, which is equivalent to stating that the weighted syndrome majority needed to change an information bit is a variable which depends upon the reliability of that particular information bit.

The Type I hard-decision decoder of FIG. 1 employs feedback of the correction signal into the syndrome register to remove the effect of a detected error from future decisions. With the charge transfer devices employed for storage in the analog decoder, such feedback is not practical. Furthermore, a replica of the encoder is not desirable in the analog version since, if implemented digitally, such a replica would ignore soft-decision information about received symbols which have not yet been decoded, and if implemented in a full analog manner, the highly-reliable digital form of information bits which have already been decoded would be ignored.

For these reasons, the modified Type I structure of FIG. 3 stores the received information and parity sequences in analog form after clamped unity gain reliability weighting without any alteration by feedback. Each syndrome bit is computed individually so that each such comparison of a recalculated parity bit and a received parity bit can be made using highly-reliable digital values for information bits already decoded and analog values corresponding to bits which have not yet been decoded.

The need to employ digital values for previously decoded bits precludes the use of a single syndrome or parity register without degenerating into the original structure of FIG. 2. Therefore, a separate analog register is needed for each of the four syndrome bits involved in the weighted majority decision. The few multipliers required, i.e. analog multipliers 124, 126 and 128, are minimized by effectively connecting the multipliers in series to share them for each of the syndrome bits to be calculated. All multiplications are performed at the inputs of each of the shift registers 118, 120 and 122, with the resulting product being inverted by an inverter 130 or 132 for each multiplication involving an even number of terms.

The effectiveness of a soft-decision decoding technique lies in its ability to correct error patterns which a comparable hard-decision approach cannot correct. With analog threshold decoding, this is accomplished by reducing the weights assigned to received bits of questionable reliability, i.e. low amplitude, thereby minimizing their effects upon the decoded output relative to the influence of the more reliable bits. Thus, the use of soft decisions may be expected to yield best results for errors consisting of opposite polarity and low signal voltage, while hard errors, i.e. strong signals of incorrect polarity, may be expected to result in performance comparable to that of a hard-decision decoder.

Figure 4:
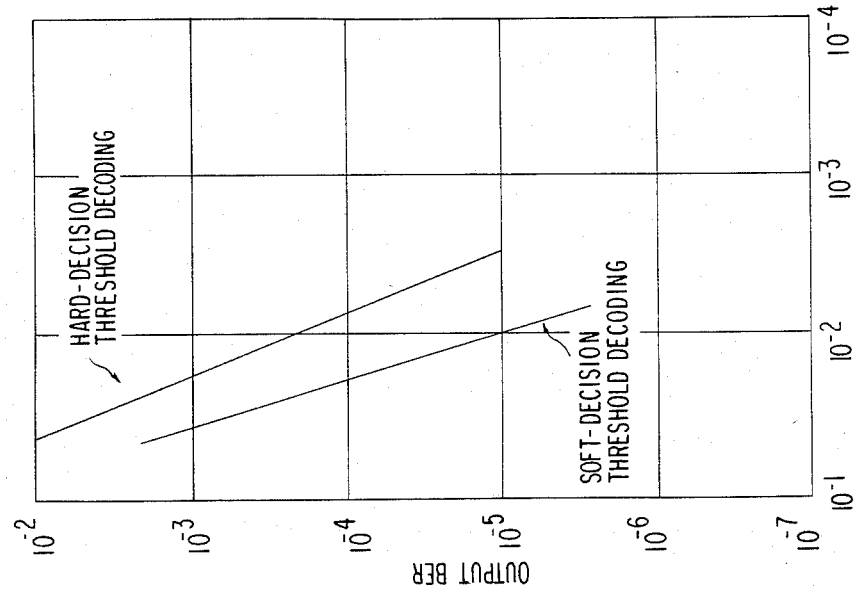
FIG. 4 is a graphical illustration of the output Bit Error Rate (BER) versus input BER for the decoder of FIG. 3.

In actual testing of the above-disclosed decoder with input reliability weighting consisting of linear unity gain accompanied by ±1-volt hard limiting and with additive white Gaussian noise, the hardware bit error rate (BER) performance is illustrated in FIG. 4. For output error rates below $10^{-3}$, the error rate of the improved analog threshold decoder is less than 1/10 that of hard-decision decoder.

Figure 5:
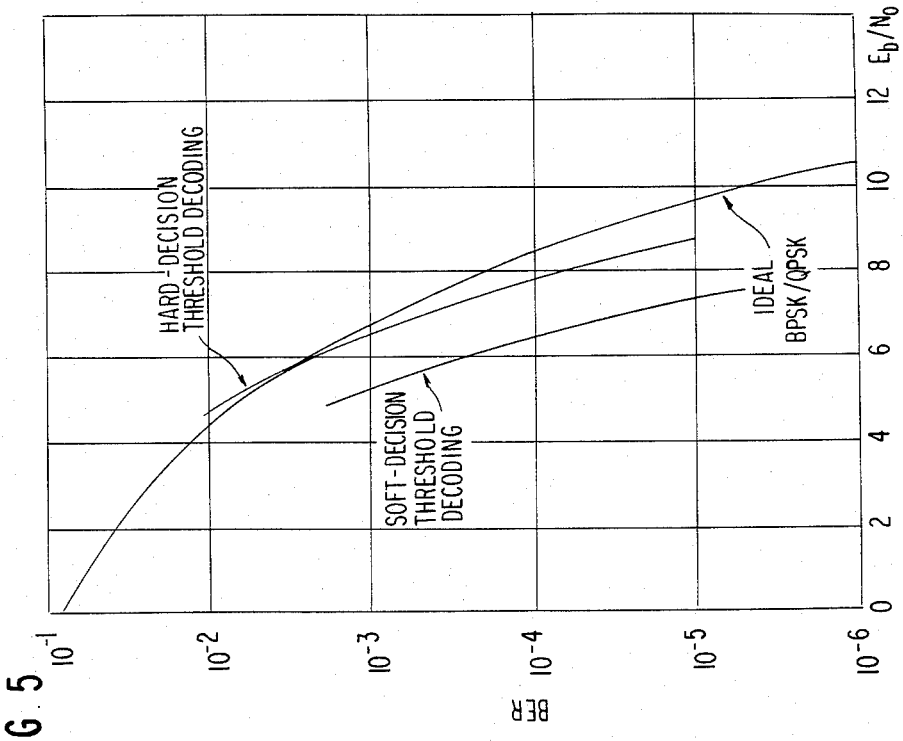
FIG. 5 is a graphical illustration of the BER versus $E_b/N_o$ for the decoder of FIG. 3.

The BER performance vs. energy-per-information-bit-to-noise-spectral-density ($E_b/N_o$) is illustrated in FIG. 5. The use of reliability-weighted soft decisions provide a fairly constant additional coding gain of approximately 1.4 dB beyond that obtained with hard-decision decoding over the BER range of $10^{-3}$ to $10^{-5}$. Coding gain is the reduction in $E_b/N_o$ permissible at a given BER due to coding and is, thus, the seperation between the coded and uncoded curves at a given BER. This performance is essentially the same as that of the reliability-weighted analog threshold decoder in my prior U.S. Pat. No. 4,322,848, but was achieved with a configuration requiring only three analog multipliers as shown in FIG. 3 rather than the twelve analog multipliers which would be required in the threshold decoder of FIG. 2. Thus, the hardware requirements are significantly reduced with no detrimental effect on performance.

It should be noted that various changes and modifications could be made to the above-disclosed embodiment without departing from the true spirit and scope of the invention as defined in the appended claims. For example, although the embodiment has been described with reference to a code having a generator polynomial G=1100101, any number of other codes could be used instead, in which case the lengths of the various shift registers may be changed, the particular tap selections from the registers changed, or the number of analog multipliers changed. Also, the particular summation network used could be changed or the relative weights given in the various summed analog signals could also be changed. It should further be noted that the modulo-2 adders 150–160 could comprise a plurality of Exclusive-OR gates as is well known in the art.

The reduction in the number of multiplications is significant in paving the way toward application of the decoding technique to codes of higher rate and/or longer constraint length, both of which factors previously resulted in an unacceptable increase in the number of multipliers needed. Furthermore, the new configuration offers a much greater opportunity for digital implementation, since binary multiplication is a fairly complex function. Digital implementation permits soft-decision threshold decoding to be considered for high-speed applications such as coded phase modulation for TDMA. It should be noted, however, that although the disclosed embodiment employs digital feedback, the novel shared multiplier arrangement of the invention could be used as well with a system employing analog feedback.

What is claimed is:

1. A threshold decoder of the type wherein a sequence of information and parity signals are received, wherein said information signals are hard-detected and each information signal is then decoded in accordance with a decision signal to obtain a respective digital decoded information signal, said decoder comprising:
   first digital storage means for storing a sequence of first digital signals resulting from hard-detection of said received information signals, said first digital signals representing information signals yet to be decoded including an information signal currently being decoded;
   second digital storage means for storing a sequence of digital decoded information signals;
   means responsive to said received information signals for providing analog values representing the value and reliability of said received information signals represented in said first digital storage means;
   means responsive to said received parity signals for providing analog values representing said received parity signals;
   first analog storage means for storing said analog values representing the value and reliability of said received information signals represented in said first digital storage means and for storing said analog values representing received parity signals;
   syndrome means for generating syndrome analog signals from combinations of signals of said first analog storage means and said second digital storage means;
   decision means for combining a plurality of decision input signals and for generating a decision signal in accordance with the combination of said plurality of decision input signals, said decision input signals including a plurality of said syndrome signals; and
   decoding means responsive to said generated decision signal for decoding said information signal currently being decoded to provide a digital decoded information signal.

2. A threshold decoder as defined in claim 1, wherein said syndrome means comprises analog multiplication means receiving and combining outputs from selected stages of said first analog storage means.

3. A threshold decoder as defined in claim 2, wherein said syndrome means further comprises second analog storage means for storing outputs from said multiplication means.

4. A threshold decoder as defined in claim 3, wherein said analog multiplication means includes a first multiplier for receiving and multiplying at least first and second signals from said analog storage means.

5. A threshold decoder as defined in claim 4, further including inverting means coupled at least between the output of said first multiplier and said second analog storage means.

6. A threshold decoder as defined in claim 4, wherein said analog multiplication means further includes a second analog multiplier for multiplying the output of said first analog multiplier by at least a third selected signal from said first analog storage means.

7. A threshold decoder as defined in claim 5, wherein said analog multiplication means further includes a second analog multiplier for multiplying the output of said first analog multiplier by at least a third selected signal from said first analog storage means.

8. A threshold decoder as defined in claim 6, wherein said analog multiplication means further includes a third analog multiplier for multiplying the output of said second multiplier by at least a fourth selected signal from said first analog storage means.

9. A threshold decoder as defined in claim 8, wherein said inverting means is provided between every other multiplier in said analog multiplication means and said second analog storage means.

10. A threshold decoder as defined in claim 3, wherein said syndrome means further includes a plurality of controllable inverters for selectively inverting analog signals from said first and second analog storage means in accordance with respective control signals, the outputs from said controllable inverters comprising said syndrome signals, said syndrome means further comprising control means for generating said control signals in accordance with at least a plurality of said decoded information signals in said second digital storage means.

11. A threshold decoder as defined in claim 10, wherein said control means comprises a plurality of modulo-2 adders each receiving as one input a digital signal from said first digital storage means representing said information signal currently being decoded and each receiving as a second input a signal derived from at least one of said decoded information signals, the outputs of said modulo-2 adders being provided as said control signals to respective ones of said controllable inverters.

12. A threshold decoder as defined in claim 10, wherein one of said controllable inverters receives as its control signal said digital signal from said first digital storage means representing said information signal currently being decoded.

13. A threshold decoder as defined in claim 1, wherein said decision means comprises a summation means for combining said decision input signals and a comparison means for generating said decision signal from the output of said summation means.

14. A threshold decoder as defined in claim 1, wherein one of said decision input signals comprises an analog signal representing the reliability of said information signal currently being decoded.

15. A threshold decoder of the type wherein sequences of information and parity signals are received and wherein selected received signals are combined in combining means to calculate new parity signals which are used in subsequent decoding of said received information signals, said combining means comprising a first analog multiplier for multiplying at least first and second ones of said received signals to generate a first new parity signal, first analog storage means for storing a sequence of outputs from said multiplier and a second analog multiplier for multiplying said first new parity signal with at least a third one of said received signals to generate a second new parity signal, said decoder further including second analog storage means for receiving and storing a sequence of outputs from said second multiplier.

16. A threshold decoder as defined in claim 5, wherein said combining means further includes a third analog multiplier for multiplying said second new parity signal with at least a fourth one of said received signals to generate a third new parity signal, said decoder further including third analog storage means for receiving and storing a sequence of outputs from said third multiplier.

17. A threshold decoder as defined in claim 16, further including inversion means for inverting the output of any one of said first through third multipliers which involves an even number of said received signals.

18. A threshold decoder as defined in claim 15, further including means for generating syndrome bits from said first through third analog storage means, means for generating a threshold signal corresponding to the magnitude of a received information signal, decoding means for decoding said received information signal in accordance with a decision signal, and decision means for generating said decision signal in accordance with a combination of said syndrome signals and threshold signal.

* * * * *

UNITED STATES PATENT AND TRADEMARK OFFICE
CERTIFICATE OF CORRECTION

PATENT NO. : 4,519,080

DATED : May 21, 1985

INVENTOR(S) : John S. SNYDER, Jr., Monrovia, Md.

It is certified that error appears in the above-identified patent and that said Letters Patent is hereby corrected as shown below:

Column 4, line 22, "fromm" should be --from--;

line 67, "syndriome" should be --syndrome--.

Column 6, line 62, "seperation" should be --separation--.

Column 10, line 3, "claim 5" should be --claim 15--.

Signed and Sealed this

Twenty-first Day of January 1986

[SEAL]

Attest:

DONALD J. QUIGG

Attesting Officer      Commissioner of Patents and Trademarks